(12) United States Patent
Liu et al.

(10) Patent No.: US 9,502,505 B2
(45) Date of Patent: Nov. 22, 2016

(54) METHOD AND STRUCTURE OF MAKING ENHANCED UTBB FDSOI DEVICES

(71) Applicants: STMICROELECTRONICS, INC., Coppell, TX (US); STMICROELECTRONICS (CROLLES 2) SAS, Crolles (FR)

(72) Inventors: Qing Liu, Watervliet, NY (US); Thomas Skotnicki, Crolles (FR)

(73) Assignees: STMICROELECTRONICS, INC., Coppell, TX (US); STMICROELECTRONICS (CROLLES 2) SAS, Crolles (FR)

(*) Notice: Subject to any disclaimer, the term of this patent is extended or adjusted under 35 U.S.C. 154(b) by 0 days.

(21) Appl. No.: 14/587,849

(22) Filed: Dec. 31, 2014

(65) Prior Publication Data

US 2016/0190315 A1    Jun. 30, 2016

(51) Int. Cl.
*H01L 29/78* (2006.01)
*H01L 29/66* (2006.01)
*H01L 29/06* (2006.01)
*H01L 29/10* (2006.01)
*H01L 29/08* (2006.01)

(52) U.S. Cl.
CPC ....... *H01L 29/1033* (2013.01); *H01L 29/0649* (2013.01); *H01L 29/0653* (2013.01); *H01L 29/0847* (2013.01); *H01L 29/66477* (2013.01); *H01L 29/66575* (2013.01); *H01L 29/7838* (2013.01)

(58) Field of Classification Search
CPC ........... H01L 29/7838; H01L 29/0653; H01L 29/66477
See application file for complete search history.

(56) References Cited

U.S. PATENT DOCUMENTS

| | | | |
|---|---|---|---|
| 7,560,347 B2* | 7/2009 | Furukawa | H01L 29/42384 438/177 |
| 2011/0133166 A1* | 6/2011 | Bangsaruntip | B82Y 10/00 257/24 |

* cited by examiner

*Primary Examiner* — Whitney T Moore
(74) *Attorney, Agent, or Firm* — Seed IP Law Group LLP

(57) ABSTRACT

An integrated circuit die includes a substrate having a first layer of semiconductor material, a layer of dielectric material on the first layer of semiconductor material, and a second layer of semiconductor material on the layer of dielectric material. An extended channel region of a transistor is positioned in the second layer of semiconductor material, interacting with a top surface, side surfaces, and potentially portions of a bottom surface of the second layer of semiconductor material. A gate dielectric is positioned on a top surface and on the exposed side surface of the second layer of semiconductor material. A gate electrode is positioned on the top surface and the exposed side surface of the second layer of semiconductor material.

20 Claims, 20 Drawing Sheets

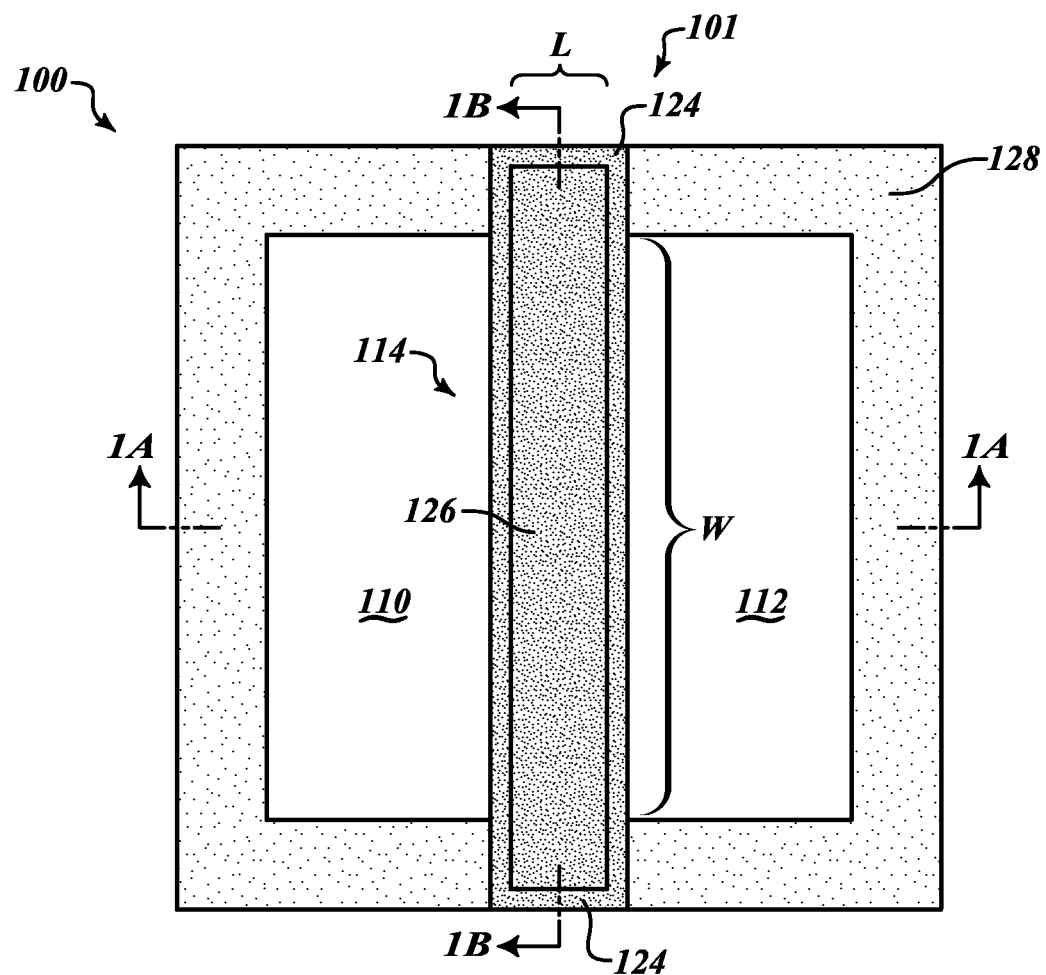
FIG. 1C *(Prior Art)*

METHOD AND STRUCTURE OF MAKING ENHANCED UTBB FDSOI DEVICES

BACKGROUND

Technical Field

The present disclosure relates to the field of integrated circuit technology. The present disclosure relates more particularly to transistors formed in integrated circuit dies.

Description of the Related Art

The transistor is a fundamental component of many integrated circuits. A single integrated circuit die can include billions of transistors formed in a semiconductor substrate. In order to decrease the cost and increase the complexity of integrated circuits, integrated circuit technology is continually scaling downward. In particular, the dimensions of the transistors are decreased in order to fit more transistors in a given area of a semiconductor substrate.

Ultra Thin Body and Box (UTBB) Fully Depleted Silicon On Insulator (FDSOI) technology provides many benefits to transistor functionality. These benefits can include adding the ability to adjust the threshold voltage $V_{th}$ of a transistor and improving electrostatics in the channel region by back biasing the channel region via application of a voltage to a bulk layer of semiconductor material separated from the channel region by a dielectric layer.

FIGS. 1A-1C illustrate an integrated circuit die 100 including a transistor 101 implementing UTBB FDSOI technology. FIGS. 1A, 1B are cross-sections of the transistor 101 in the integrated circuit die 100, while FIG. 1C is a top view of the transistor in the integrated circuit die.

With reference to FIG. 1A, the integrated circuit die 100 includes the transistor 101 formed on an FDSOI substrate 102. The FDSOI substrate 102 includes a first layer of semiconductor material 104, a buried oxide layer (BOX) 106, and a second layer of semiconductor material 108. A raised source region 110 and a raised drain region 112 extend from the second layer of semiconductor material 108. A gate structure 114 overlies a channel region 116 positioned in the second layer of semiconductor material 108. The gate structure 114 includes a gate dielectric 118 positioned directly over the channel region 116 of the transistor 101, a metal gate positioned on the gate dielectric 118. The metal gate includes a conductive liner 120 and a gate electrode 122 positioned on the gate dielectric. Sidewall spacers 124 are positioned between the raised source and drain regions 110, 112 and the gate dielectric 118. A dielectric cap 126 is positioned on the gate electrode 122. A shallow trench isolation region 128 is formed in the substrate 102 on each side of the second layer of semiconductor material 108.

The cross-sectional view of FIG. 1B shows many of the same layers and structures as shown in FIG. 1A, but from a view perpendicular to the view shown in FIG. 1A as can be more clearly understood with reference to the cross section lines 1A, 1B indicated in FIG. 1C. In particular, the cross-section of FIG. 1B does not pass through the source and drain regions 110, 112 of the transistor 101. Thus, the raised source and drain regions 110, 112 are not apparent in FIG. 1B. FIG. 1B illustrates that the sidewall spacers 124 are positioned over the trench isolation 128 at either end of the gate structure 114.

The transistor 101 allows a drain current $I_D$ to flow from the drain 112 to the source 110 through the channel region 116 in the second layer of semiconductor material 108 below the gate dielectric 118. The drain current $I_D$ can be controlled by applying a voltage to the gate electrode 122. In CMOS applications, the transistor 101 is typically used as a simple switch having an on mode and an off mode. When the transistor 101 is off, the drain current $I_D$ is substantially zero. When the transistor 101 is on, the transistor operates in saturation mode and the drain current $I_D$ flows between the drain region 112 and the source region 110. The magnitude of the drain current $I_D$ is approximated by the following formula:

$$I_D = \mu_n \left(\frac{C_{ox}}{2}\right)\left(\frac{W}{L}\right)(V_{gs} - V_{th})^2.$$

As can be seen from the expression above, the drain current $I_D$ depends on many factors, including the carrier mobility ($\mu_n$ for n-channel devices, $\mu_p$ for p-channel devices), the gate oxide capacitance $C_{ox}$, the ratio of the channel width W to the channel length L, the threshold voltage $V_{th}$ of the transistor, and the gate to source voltage $V_{gs}$. Thus, a selected value for the drain current $I_D$ can be achieved by selecting particular values for $V_{gs}$, the width to length ratio W/L, the carrier mobility $\mu_n$, and the gate oxide capacitance $C_{ox}$.

In some applications, it is beneficial to have a relatively high current footprint, i.e., a high amount of current per surface area of a semiconductor substrate. However, as integrated circuit technology continues to scale downward, there are difficulties involved with maintaining a high current density while scaling down the dimensions of the transistors. For example, as the dimensions of the transistors continue to scale downward, the supply voltages available to the integrated circuit die typically decrease as well in order to reduce power consumption and to not damage the transistors.

As can be seen from the drain current equation above, one way to increase the drain current ID is to increase the channel width W and/or to decrease the channel length L. As seen in FIGS. 1B and 1C, the width W of the channel 116 corresponds to the portion of the gate structure 114 that is directly over the second layer of semiconductor material 108 between trench isolation regions 128. The length L of the channel region 116 corresponds to the length of the gate electrode 122 directly above the second layer of semiconductor material 108 between the source and drain regions 110, 112.

The extent to which the channel width L can be decreased is limited in part by restraints associated with photolithography techniques. Likewise, simply increasing the width W of the channel 116 in a conventional manner by extending the gate structure 114 reduces the number of transistor that can be formed in a given area of a semiconductor substrate. Thus, increasing the width to length ratio W/L in a planar transistor can be difficult.

BRIEF SUMMARY

One embodiment is an integrated circuit die including a transistor having an increased channel width with respect to some conventional planar transistors. A gate dielectric and a gate electrode of the transistor are positioned not only above a semiconductor substrate in which a channel region of the transistor is positioned, but on exposed sidewalls of the semiconductor substrate, thereby increasing the width of the channel region by a thickness of the semiconductor substrate.

In one embodiment, the integrated circuit die includes a silicon on insulator substrate having a first layer of semiconductor material, a first layer of dielectric material positioned directly on the first layer of semiconductor material, and a second layer of semiconductor material positioned directly on the first layer of dielectric material. The channel region of the transistor is positioned in the second layer of semiconductor material. The gate dielectric is positioned directly on a top surface and on a sidewall of the second layer of semiconductor material. The gate electrode is positioned directly on the gate dielectric on the top surface and on the sidewall of the second layer of semiconductor material.

In one embodiment, the gate dielectric and the gate electrode are positioned on an exposed portion of a bottom surface of the second layer of semiconductor material. This further increases the channel width by the width of the exposed portion of the bottom surface of the second layer of semiconductor material.

One embodiment is directed to a method of forming a transistor having an increased channel width with respect to some conventional planar transistors. The method includes exposing a sidewall of a first layer of semiconductor material by etching a trench isolation region in the first layer of semiconductor material. The method further includes forming a gate dielectric directly on the exposed sidewall and on a top surface of the first layer of semiconductor material and forming a gate electrode directly on the gate dielectric on the sidewall and on the top surface of the first layer of semiconductor material.

In one embodiment, the first layer of semiconductor material is positioned directly on a first layer of dielectric material. The first layer of dielectric material is positioned directly on a second layer of semiconductor material. The method can include exposing a portion of a bottom surface of the first layer of semiconductor material by etching a portion of the first layer of dielectric material, forming the gate dielectric directly on the exposed portion of the bottom surface of the first layer of semiconductor material, and forming the gate electrode directly on the gate dielectric on the exposed portion of the bottom surface of the first layer of semiconductor material.

BRIEF DESCRIPTION OF THE SEVERAL VIEWS OF THE DRAWINGS

FIGS. 1A-1C illustrate views of a known integrated circuit die.

DETAILED DESCRIPTION

Figure 1A:
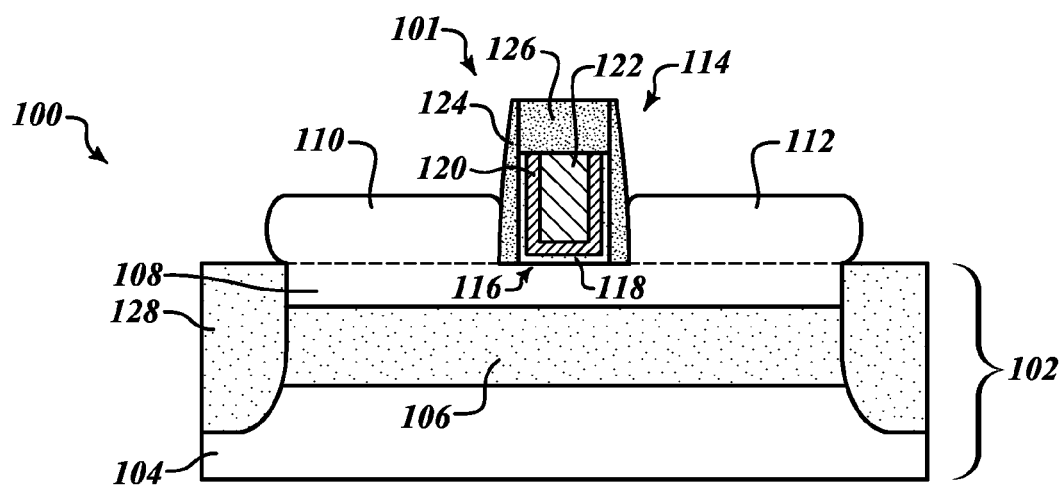
Figure 1B:
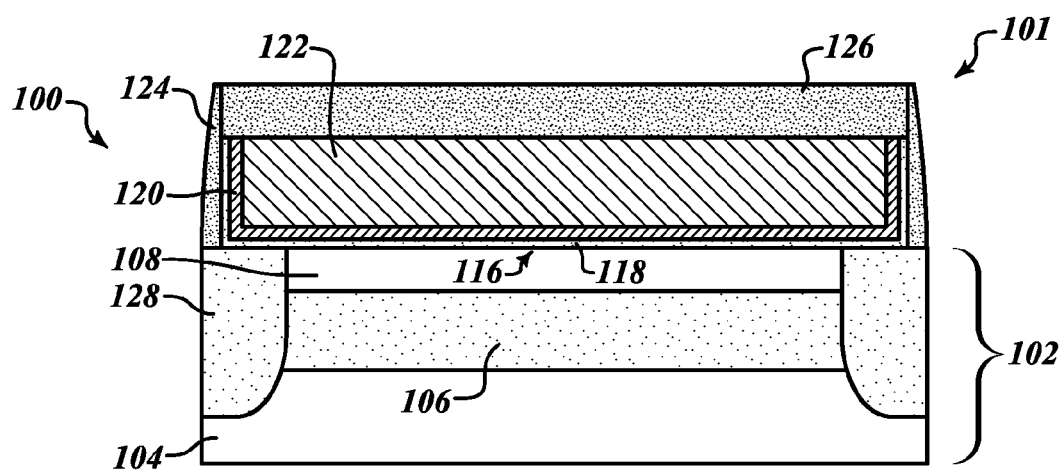
Figure 2A:
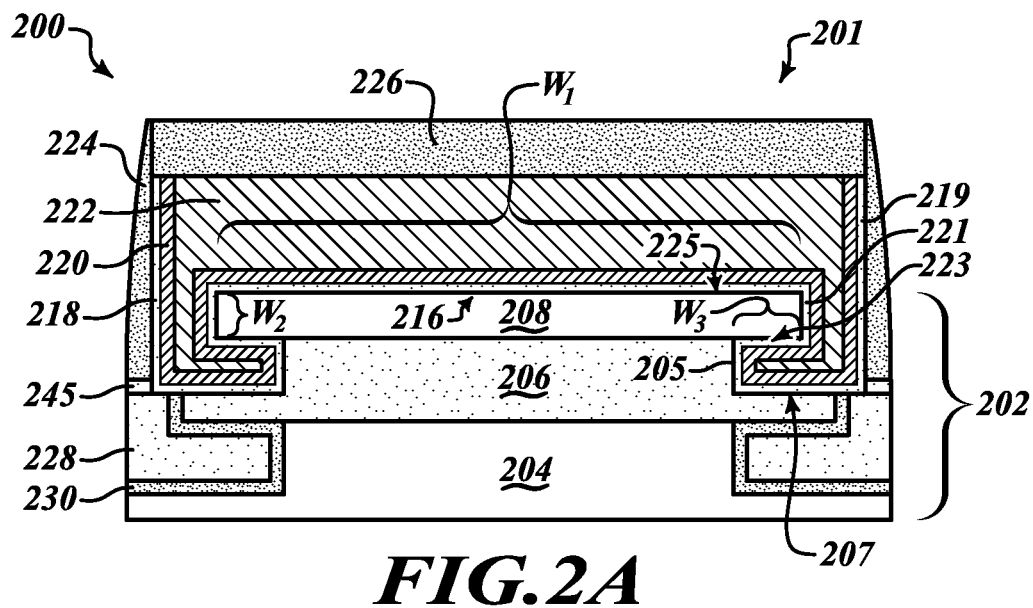
FIGS. 2A-2C illustrate views of an integrated circuit die including a transistor, according to one embodiment.
Figure 2B:
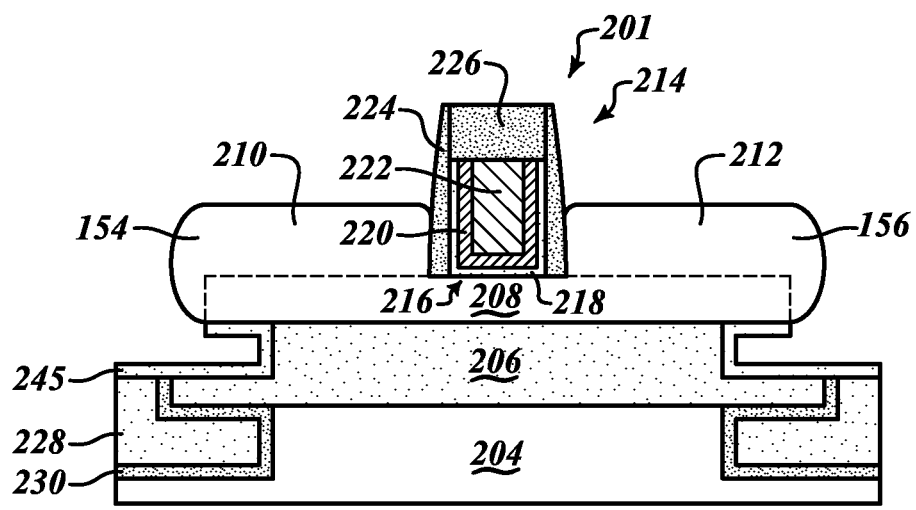
Figure 2C:
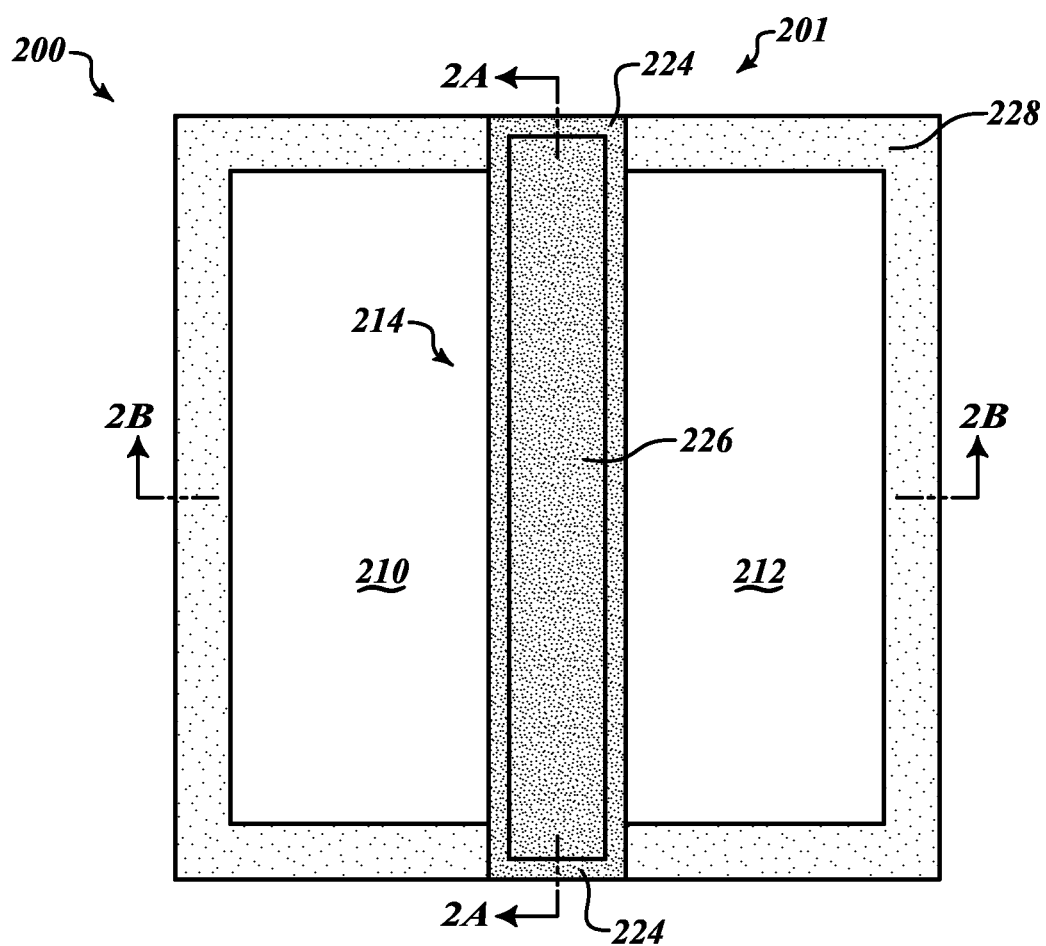

FIGS. 2A-2C illustrate an integrated circuit die 200 including a transistor 201 having an increased channel width W (a combination of $W_1$, $W_2$, $W_3$) as compared to the conventional transistor 101 of FIGS. 1A-1C. FIG. 2A is a cross-sectional view of the integrated circuit die 200. FIG. 2B is a cross-sectional view of the integrated circuit die 200. FIG. 2C is a top view of the integrated circuit die 200 of FIGS. 2A, 2B.

The integrated circuit die 200 of FIG. 2A includes a substrate 202, which may be a Ultra Thin Body and Box (UTBB) Fully Depleted Silicon On Insulator (FDSOI) substrate. The substrate 202 includes a first layer of semiconductor material 204, a buried oxide (BOX) layer 206 positioned on the first layer of semiconductor material 204, and a second layer of semiconductor material 208 positioned on the BOX layer 206. A portion of the BOX layer 206 has been removed below the second layer of semiconductor material 208. A gate dielectric 218 is positioned on the second layer of semiconductor material 208, on exposed sides 205 of the BOX layer 206, on a top surface 207 of the BOX layer 206 and along sidewalls 224. A gate electrode includes a liner 220 positioned on the gate oxide 218 and conductive material 222 is positioned on the liner 220. Sidewall spacers 224 are positioned adjacent to vertical portions 219 of the gate dielectric 218. A dielectric cap 226 is positioned on the conductive material 222, on the liner 220, and on the gate dielectric 218. A channel region 216 of the transistor 201 corresponds to the portions of the second layer of semiconductor material 208 in contact with the gate dielectric 218. Trench isolation regions 228 are formed in the first layer of semiconductor material 204 and lined with a protective dielectric liner 230. An oxide layer 245 is positioned between the shallow trench isolation 228 and the sidewalls 224.

With reference to FIG. 2B, the integrated circuit die 200 includes a raised source region 210 and a raised drain region 212 that extend vertically from the second layer of semiconductor material 208. The sidewall spacers 224 are positioned between the raised source and drain regions 210, 212 and the conductive material 222. For simplicity, the gate, source, and drain contacts, as well as inter-metal dielectric layers, are not shown in FIGS. 2A-2C.

The transistor 201 has three terminals: the source 210, the drain 212, and the conductive material 222, i.e. a gate electrode. By applying selected voltages to the source 210, the drain 212, and the gate electrode, a drain current $I_D$ will flow from the drain 212 to the source 210 through the channel region 216.

In CMOS applications, the transistor 201 acts as a switch that can be turned on or off. When the transistor 201 is on, the drain current $I_D$ flows from the drain 212 to the source 210. When the transistor 201 is off, the drain current $I_D$ does not flow. In saturation mode, the drain current $I_D$ can be approximated by the following expression:

$$I_D = \mu_n \left(\frac{C_{ox}}{2}\right)\left(\frac{W}{L}\right)(V_{gs} - V_{th})^2.$$

As can be seen from the expression above, the drain current $I_D$ is proportional to the channel width W. Thus, one way to increase the drain current $I_D$ is to increase the channel width W.

The transistor 201 has an increased effective channel width W in comparison to the transistor 101 of FIGS. 1A-1C. With reference to FIG. 2A, the effective width of the channel 216 corresponds to the portion of the surface of the second layer of semiconductor material 208 that is in direct contact with the gate dielectric 218. Because the second layer of semiconductor material 208 and the BOX layer 206 have been etched to expose sidewalls 221 and portions of a bottom surface 223 of the second layer of semiconductor material 208, the gate dielectric 218 is not only positioned on a top surface of the second layer of semiconductor material 208, but on the sidewalls 221 and the exposed portions of the bottom surface 223 of the second layer of semiconductor material 208. The liner 220 is positioned on the gate dielectric 218 on the top surface, exposed sidewalls, and exposed portions of the bottom surface of the second layer of semiconductor material 208. Thus, when a voltage is applied between the conductive material 222 and the source 210 (in addition to applying a voltage between the source 210 and drain 212) to turn the transistor 201 on, channel inversion occurs along all of the surface of the second layer of semiconductor material 208 that is adjacent to the gate dielectric 218. The effective width W of the channel 216 therefore includes the width $W_1$ of the top surface of the second layer of semiconductor material 208, the width $W_2$ of the exposed sidewalls of the second layer of semiconductor material 208, and the width $W_3$ of the exposed portions of the bottom surface of the second layer of semiconductor material 208. The total effective channel width W can be approximated by the following expression:

$$W=W_1+2W_2+2W_3.$$

The effective channel width W of the transistor 201 can be up to 50% greater than the channel width W of the transistor 101. Thus, the drain current $I_D$ can be up to 50% greater than the drain current $I_D$ of the transistor 101 while consuming the same area of semiconductor substrate as the transistor 101. The current footprint of the transistor 201 is, therefore, increased with respect to the current footprint of the transistor 101 of FIGS. 1A-1C.

The materials, dimensions, and processes for forming the transistor 201 will be described in greater detail below with respect to FIGS. 2D-2Y.

Figure 2D:
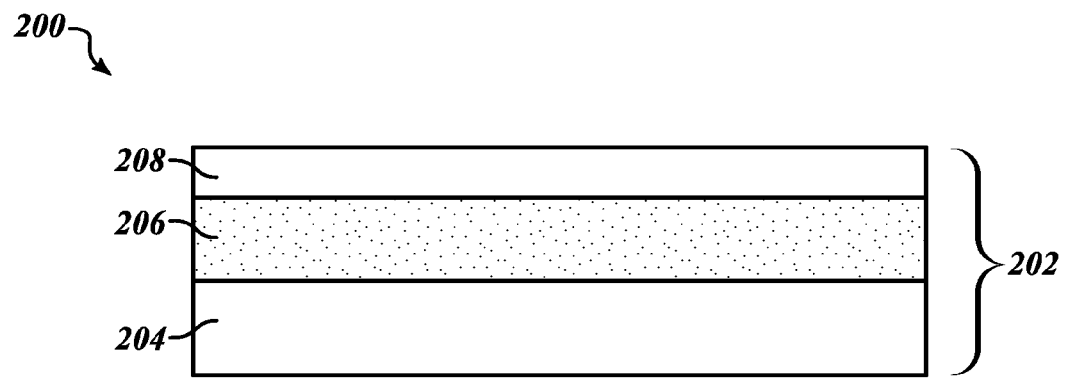
FIGS. 2D-2Y illustrate views of an integrated circuit die including a transistor at various stages of processing, according to one embodiment.

FIG. 2D illustrates the integrated circuit die 200 at an intermediate stage of processing. The integrated circuit die 200 includes the substrate 202, which may be an FDSOI substrate according to one embodiment. The substrate 202 includes the first layer of semiconductor material 204, the BOX layer 206 directly on top of the first layer of semiconductor material 204, and the second layer of semiconductor material 208 directly on top of the BOX layer 206.

In one embodiment, the first layer of semiconductor material 204 is monocrystalline silicon between 10 and 30 nm thick. The BOX layer 206 is silicon dioxide between 10 and 25 nm thick. The second layer of semiconductor material 208 is monocrystalline silicon between 5 and 8 nm thick. Alternatively, other semiconductor materials and dielectric materials can be used for the first and second layers of semiconductor material 204, 208 and the BOX layer 206.

Because the second layer of semiconductor material 208 is particularly thin, a depletion region at junctions between the source/channel 210, 216 and the drain/channel 212, 216 extends fully between top and bottom surfaces of the second layer semiconductor material 208. For this reason the substrate 202 is a fully depleted SOI substrate. Nevertheless, while the embodiments shown and discussed with respect to FIGS. 2A-2Y are described as including an FDSIO substrate 202, partially depleted SOI substrates, or entirely different semiconductor substrates can be used in accordance with principles of the present disclosure as will be understood by those of skill in the art in light of the present disclosure.

Figure 2E:
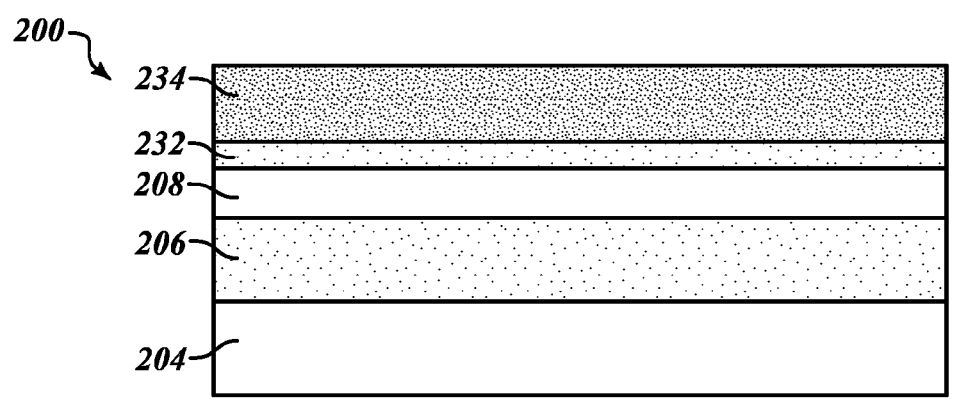

In FIG. 2E, a pad oxide layer 232 is formed on the second layer of semiconductor material 208. The pad oxide layer 232 can be formed by heating the integrated circuit die 200 while the second layer of semiconductor material 208 is exposed to oxygen. The pad oxide layer 232 can be between 1 and 3 nm thick.

A layer of silicon nitride 234 is then formed on the pad oxide layer 232. The silicon nitride is, for example, formed by chemical vapor deposition (CVD), plasma enhanced chemical vapor deposition (PECVD), or other suitable processes for forming a layer of silicon nitride on in an integrated circuit die.

Figure 2F:
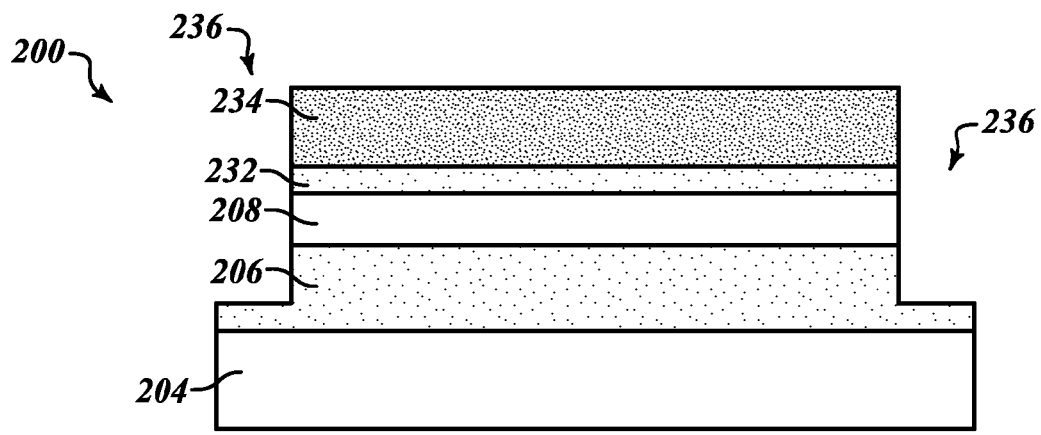

In FIG. 2F, trenches 236 are etched in the integrated circuit die 200. In particular, the integrated circuit die 200 is masked and etched using known photolithography techniques.

In one embodiment, the trenches 236 are formed in multiple etch steps. For example, a first etch can be performed to etch the silicon nitride layer 234, a second etch can etch the pad oxide 232, and a third etch can etch the second layer of semiconductor material 208, and a fourth etch can etch the BOX layer 206. The silicon nitride layer 234 can be etched using hot phosphoric acid. The pat oxide 232 and the BOX layer 206 can be etched using hydrofluoric acid (HF). The second layer of semiconductor material 208 can be etched using potassium hydroxide, KOH. The final etch in FIG. 2F stops before etching completely through the BOX layer 206. This can be accomplished by using a timed etch when etching the BOX layer 206.

Figure 2G:
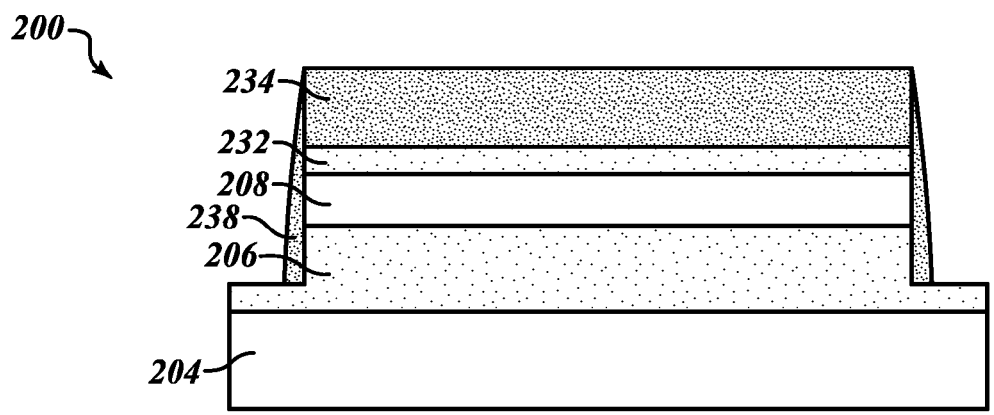

In FIG. 2G, silicon nitride spacers 238 are formed on the sides of the trenches 236. The silicon nitride spacers 238 protect the BOX layer 206 in subsequent steps as will be explained in more detail below. The silicon nitride spacers 238 can be formed by chemical vapor deposition or by any other suitable method for forming a layer of silicon nitride.

Figure 2H:
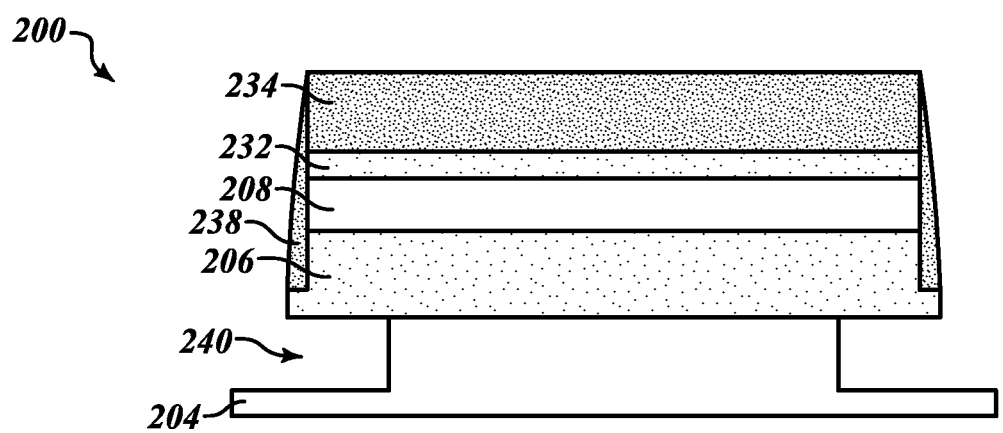

In FIG. 2H, the exposed portions of the BOX layer 206 are etched and removed, exposing the first layer of semiconductor material 204. The silicon nitride layers 234, 238 can act as a hard mask for this etch step. Subsequently, a portion of the first layer of semiconductor material 204 is etched via an etch, such as an anisotropic etch, again with the silicon nitride layers 234, 238 acting as a hard mask.

A lateral etch of the first layer of semiconductor material 204 is then carried out to form recesses 240 in the first layer of semiconductor material 204. The lateral etch can be performed by epitaxially growing silicon germanium on the first layer of semiconductor material 204. When silicon germanium is epitaxially grown from a silicon substrate, silicon germanium will consume some of the silicon substrate. In other words, rather than merely adding silicon germanium to the surface of the silicon substrate, some of the silicon substrate is consumed and becomes silicon germanium. In the case of FIG. 2H, the silicon germanium will consume some of the first layer of semiconductor material 204 below the BOX layer 206. Subsequently, the silicon germanium can be selectively etched with respect to the pure silicon of the first layer of semiconductor material 204, thereby leaving recesses 240 below the BOX layer 206. The silicon germanium can be selectively etched using HCl or an SC1 etching process. In an alternative embodiment, the silicon germanium can be deposited by CVD and accompanied by a thermal drive in instead of epitaxially growing the silicon germanium.

Figure 2I:
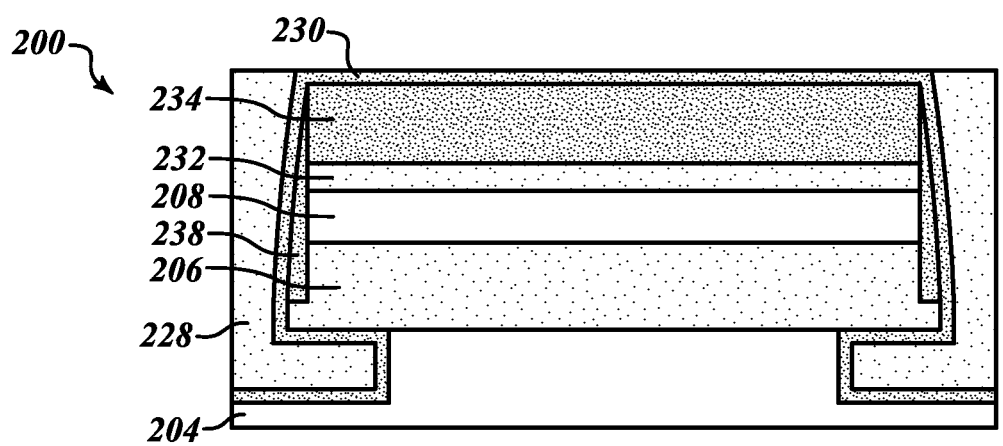

In FIG. 2I, a dielectric liner 230 is formed on the exposed portions of the integrated circuit die 200. In one example, the dielectric liner 230 is silicon nitride. Alternatively, the dielectric liner 230 can be HfO2, HfSiOx, AlOx, or another material that is highly resistant to being etched by HF. Silicon dioxide is then deposited on the dielectric liner 230 in order to form shallow trench isolation regions (STI) 228. The silicon dioxide can be deposited by CVD, PECVD, or any other suitable process.

Figure 2J:
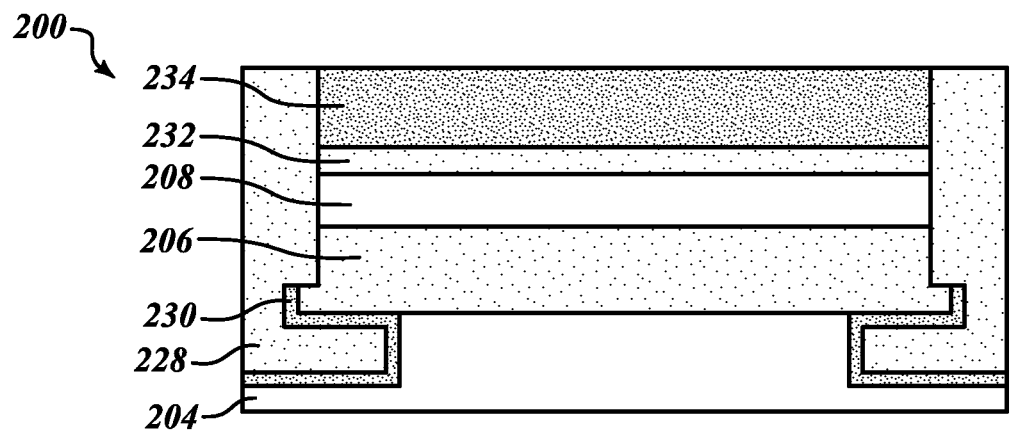

In FIG. 2J, the STI 228 is etched back to the BOX layer 206 with an HF etch. The dielectric liner 230 and the silicon nitride layer 234 can act as a hard mask when etching back the STI 228. After the STI has been etched back, the exposed portion of the dielectric liner 230 is etched back to the position shown in FIG. 2J. The silicon nitride spacers 238 are also removed. The dielectric liner layers 230 and the silicon nitride spacers 238 can be removed in a single etch step with no mask applied. Because the silicon nitride layer 234 is much thicker than the dielectric liner 230 and the silicon nitride spacers 238, only a small portion of the silicon nitride layer 234 is removed.

The shallow trench isolation region 228 is then refilled by depositing silicon dioxide. The silicon dioxide can be deposited by CVD or by any other suitable process as described previously. After the shallow trench isolation region 228 is refilled with silicon dioxide, a chemical mechanical planarization process is performed on the top of the integrated circuit die 200 to level the silicon nitride layer 234 and the silicon dioxide of the shallow trench isolation region 228.

Figure 2K:
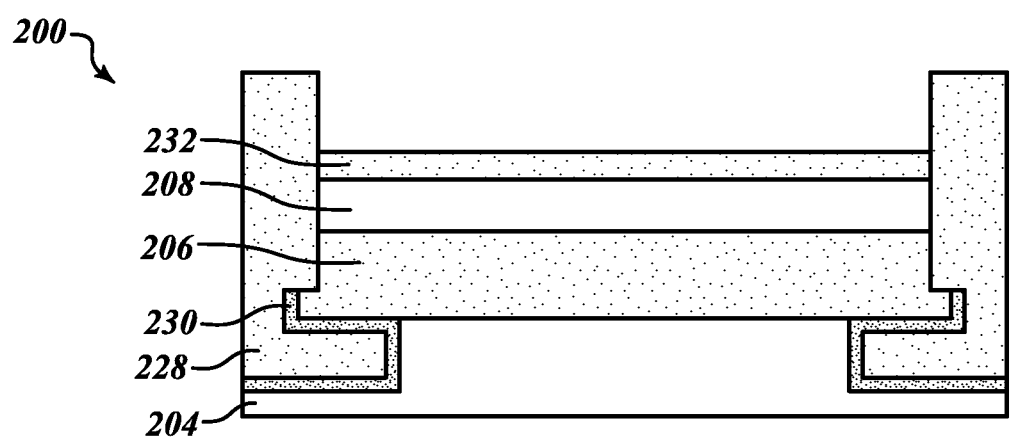

In FIG. 2K, the silicon nitride layer 234 is etched and removed. The silicon nitride layer 234 can be removed without a mask by using an etchant that selectively etches silicon nitride with respect to silicon dioxide as described previously.

Figure 2L:
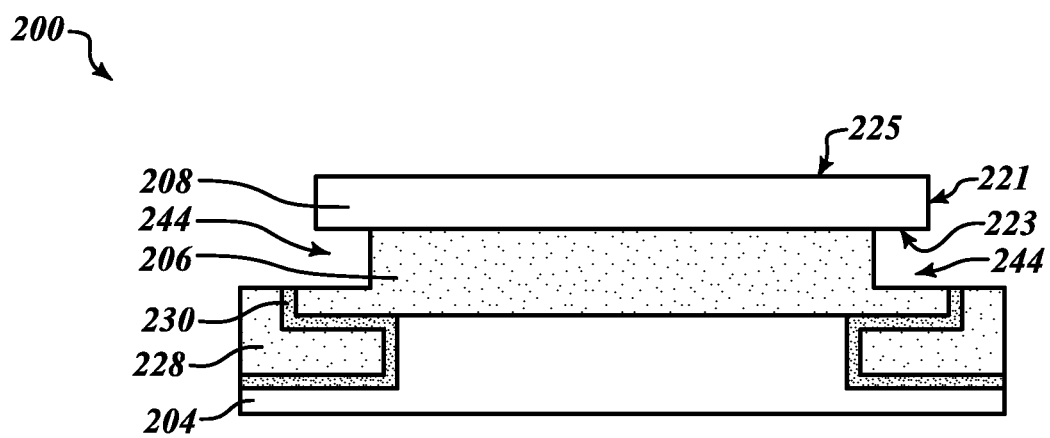

In FIG. 2L, the integrated circuit die 200 is subjected to a strong HF wet etch. The strong wet etch completely removes the pad oxide 232 and etches the shallow trench isolation 228 back to the dielectric liner 230. The BOX layer 206 is also etched by the high concentration of HF, leaving recesses 244 and the BOX layer 206 beneath the second layer of semiconductor material 208. The recesses 244 are, for example, between 5 and 10 nm. This exposes the top surface 225, the side surfaces 221, and the bottom surface 223 of the second semiconductor layer 208.

Figure 2M:
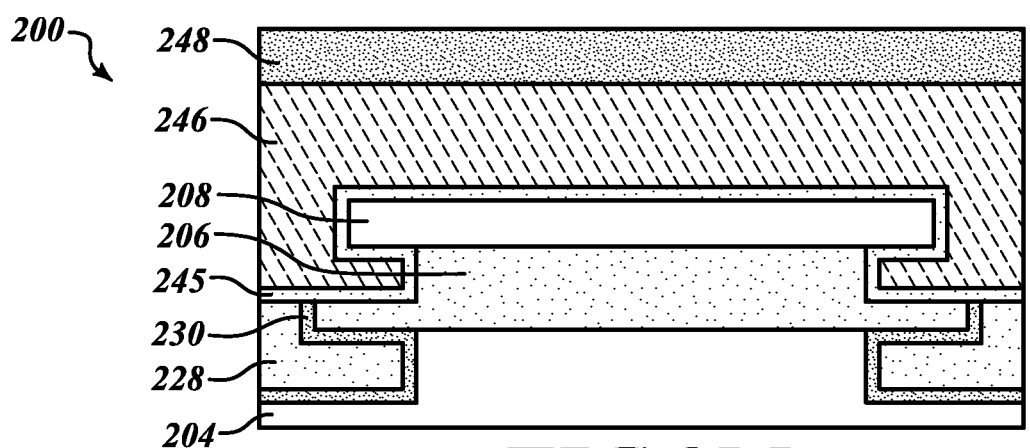

In FIG. 2M, the thin dummy gate oxide 245 is formed on the exposed portions of the integrated circuit die 200. A polysilicon dummy gate 246 is then formed on the dummy gate oxide 245. A silicon nitride hard mask 248 is then deposited on the polysilicon 246. The dummy gate oxide 245 and the polysilicon dummy gate 246 fill the recesses 244 in the BOX layer 206. In one embodiment, the dummy gate oxide 245, the polysilicon dummy gate 246, and the silicon nitride hard mask 248 are formed as part of a replacement metal gate process, as will be explained in more detail below. In an alternative embodiment, amorphous silicon can be used instead of polysilicon for the layer 246.

Figure 2N:
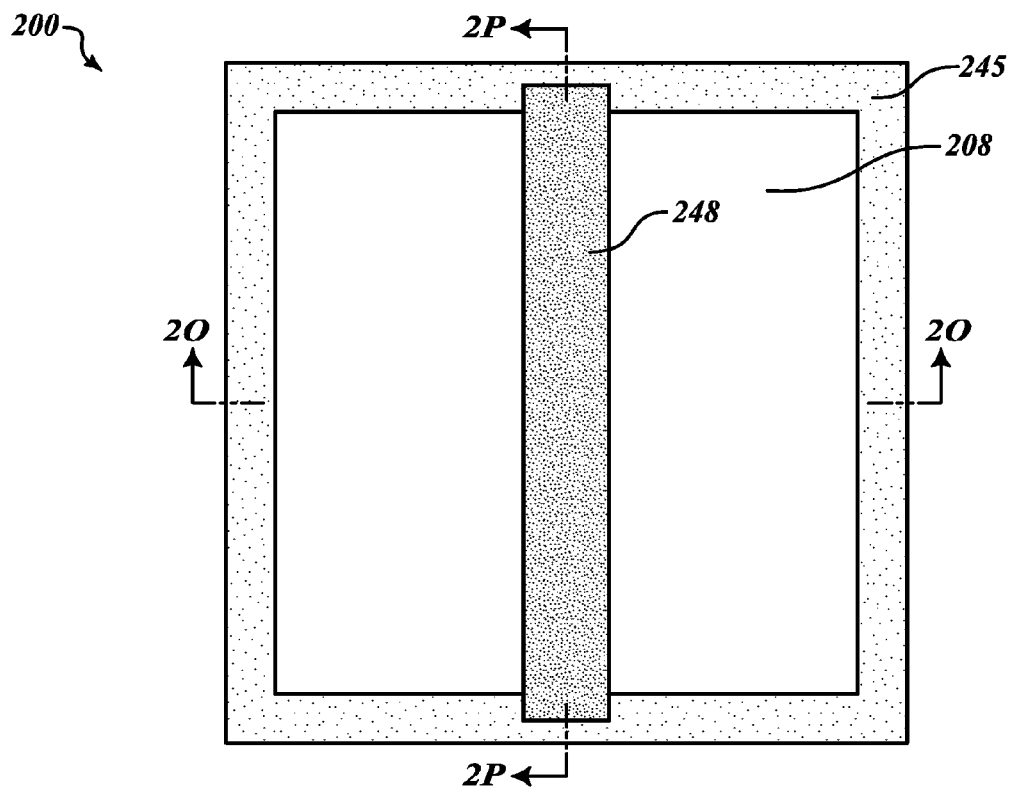

FIG. 2N is a top view of the integrated circuit die 200 according to one embodiment. In FIG. 2N, the hard mask 248, the dummy gate 246, and the dummy gate oxide 245 have been photolithographically masked and etched with a reactive ion etch (RIE) leaving only a strip of the dummy oxide 245. The remaining polysilicon dummy gate 246 and hard mask 248 are in a position that will become the gate structure 214 of the transistor 201 as described in more detail below. In order to ensure that no polysilicon 246 is left in the recesses 244, an isotropic etch is performed to remove the polysilicon from the recesses 244.

Figure 2O:
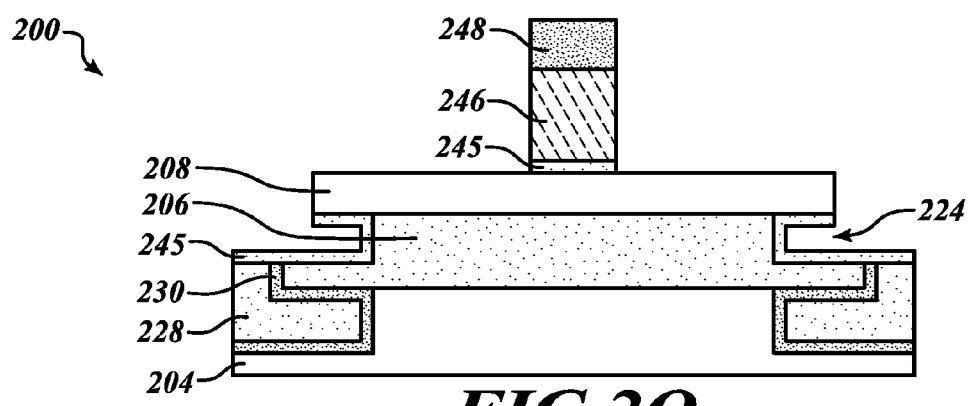
Figure 2P:
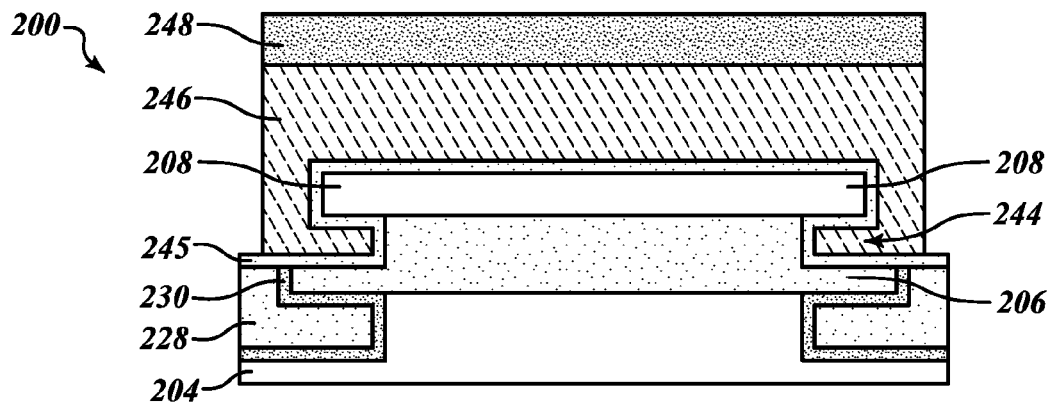

FIG. 2O is a cross-section of the integrated circuit die 200 of FIG. 2N taken along cross-section lines 2O as seen in FIG. 2N. FIG. 2P is a cross-section of the integrated circuit die 200 of FIG. 2N taken along cross-section lines 2P as seen in FIG. 2N.

Figure 2Q:
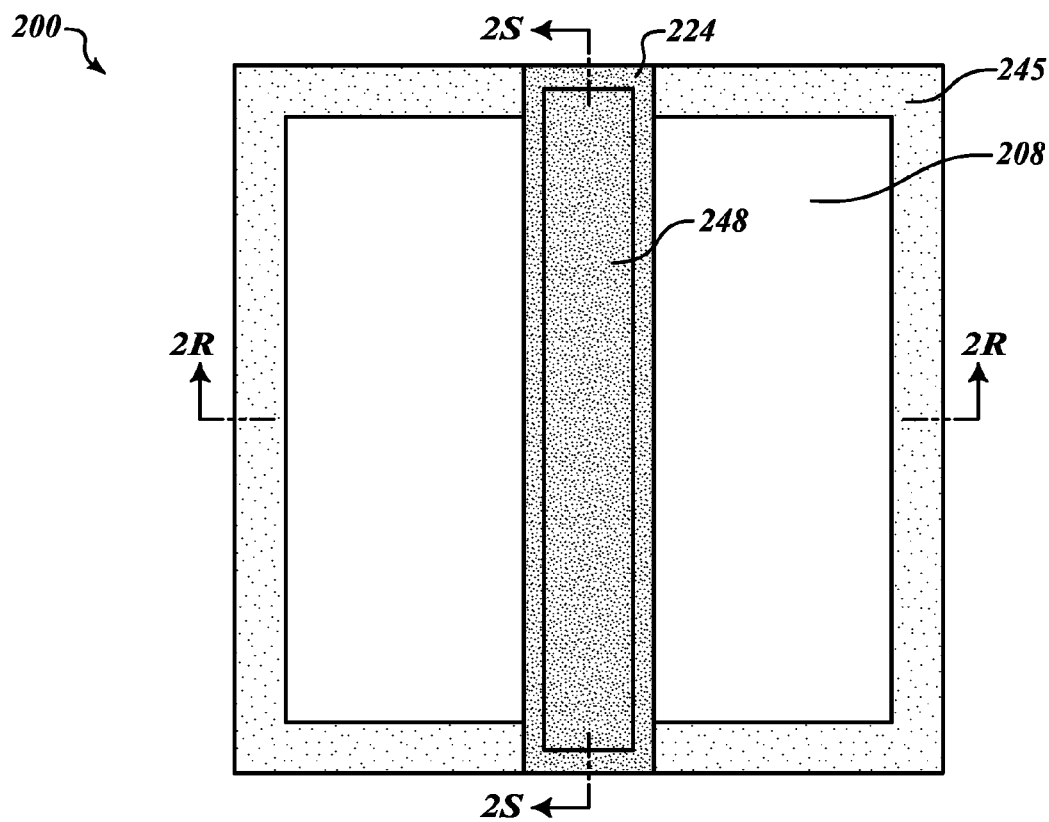
Figure 2R:
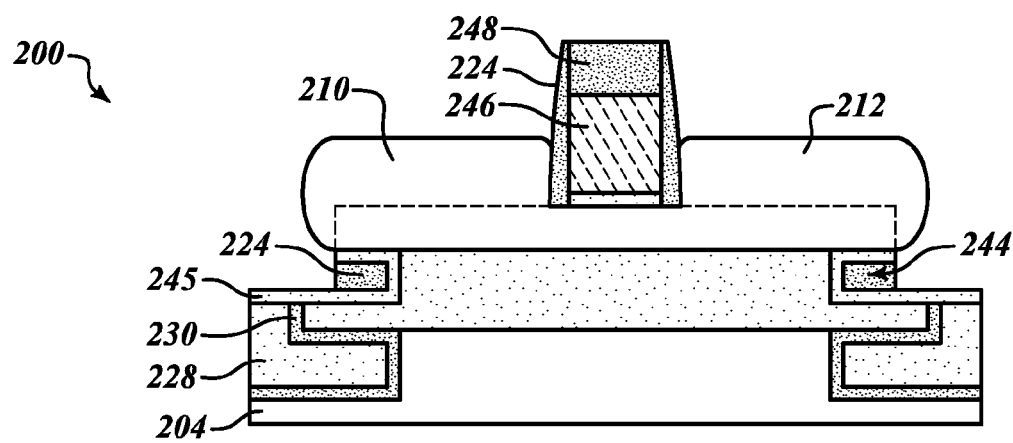
Figure 2S:
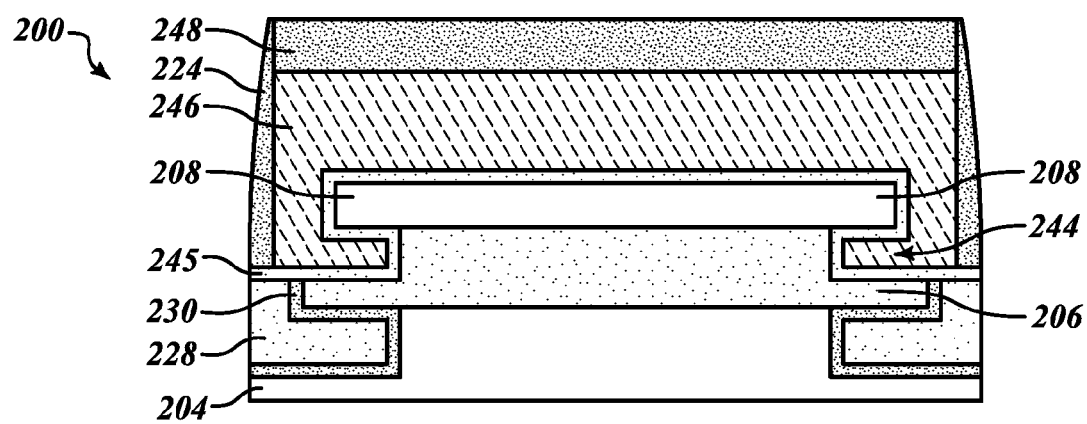

FIG. 2Q is a top view of the integrated circuit die 200 after silicon nitride sidewall spacers 224 have been formed around the dummy gate structure including the dummy gate oxide 245, the dummy polysilicon 246, and the hard mask 248. After formation of the sidewall spacers 224, an epitaxial growth process is performed on the second layer of semiconductor material 208 in order to form raised source and drain regions 210, 212 as seen in FIG. 2R. In the epitaxial growth, silicon accumulates on the second layer of semiconductor material in such a manner that the accumulation is of a monocrystalline structure with the second layer of semiconductor material 208. Dopant ions are then implanted into the epitaxially grown source and drain regions 210, 212 according to known processes. As can be seen from the cross-section of FIG. 2R, the silicon nitride sidewall spacers also formed in the exposed portions of the recesses 244. The silicon nitride sidewall spacers 224 do not form in the portions of the recesses 244 still filled with polysilicon 246 as seen in FIG. 2S.

Dopant ions are deposited in the raised source and drain regions 210, 212. The type of dopant ions, N or P, is selected based on whether the transistor 201 is an N-channel or a P-channel device in accordance with well understood principles of integrated circuit design. Though not shown in the Figures, a layer of silicide can also be formed on the source and drain regions 210, 212.

Figure 2T:
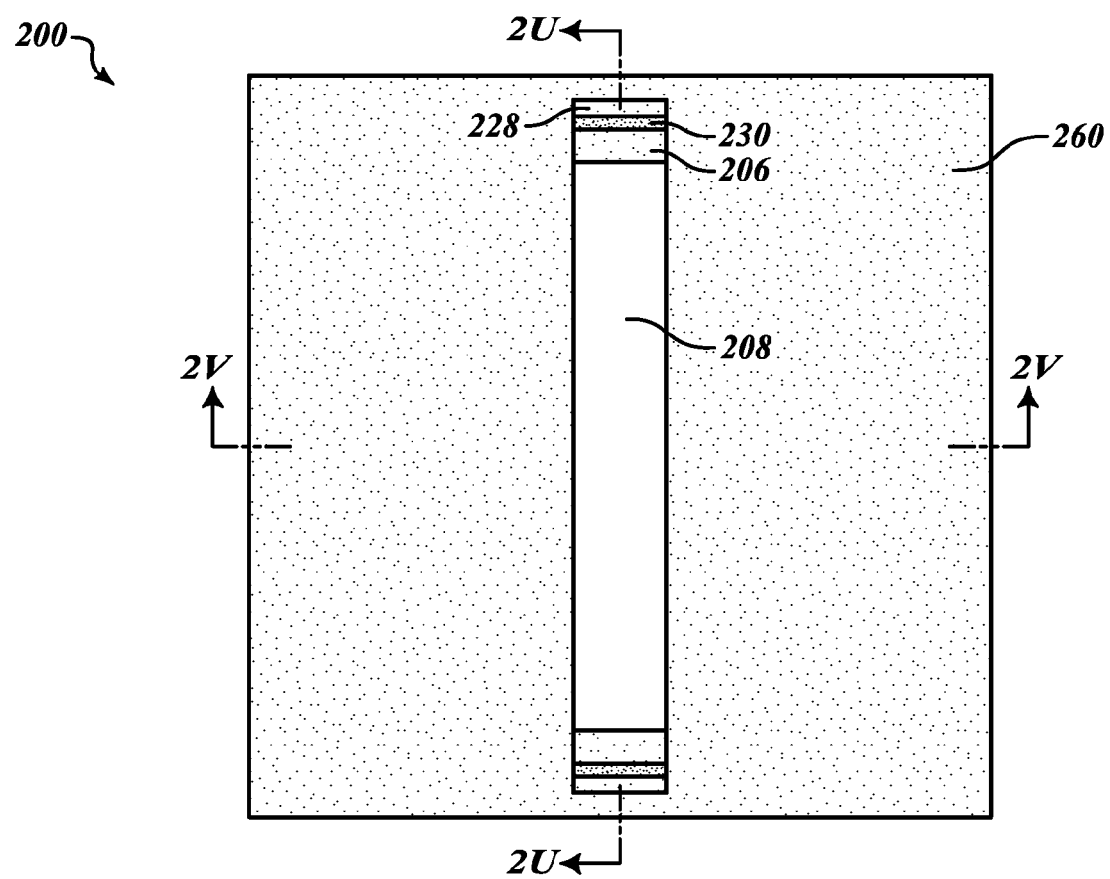
Figure 2U:
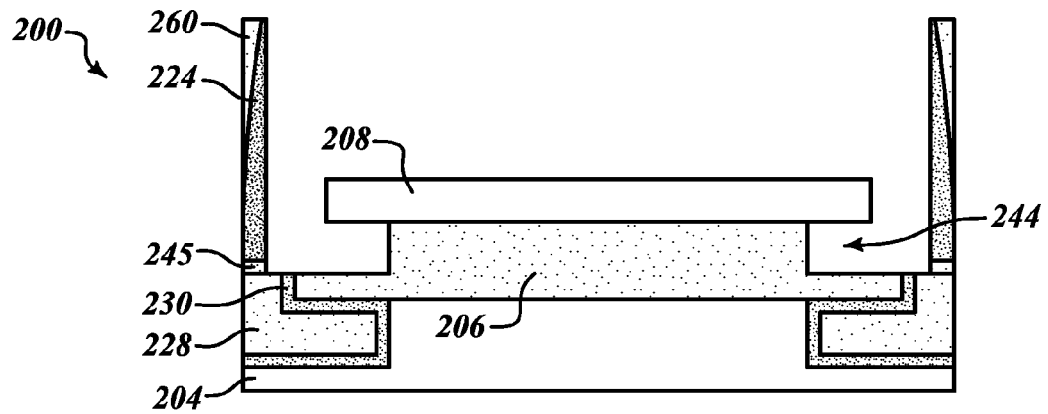
Figure 2V:
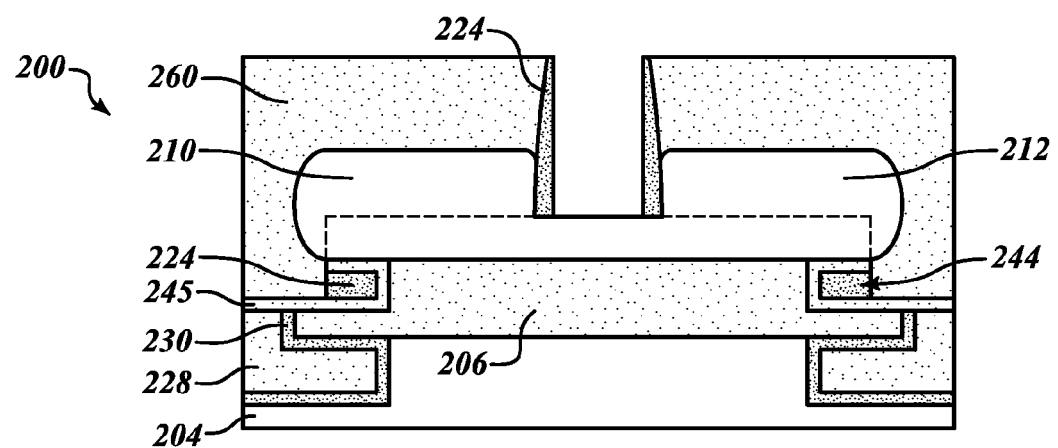

FIGS. 2T-2V are views of the integrated circuit die 200 after an inter-level dielectric layer 260 has been formed on the integrated circuit die 200, and after the dummy gate oxide 245, the dummy polysilicon gate 246, and the hard mask 248 have been removed. In one embodiment, the inter-level dielectric layer 260 is silicon dioxide. Alternatively, the inter-level dielectric layer 260 can be a low K dielectric, aerogel, or a combination of layers of dielectric materials.

FIG. 2T is a top view of the integrated circuit die 200 showing the inter-level dielectric layer 260 and the exposed portion of the second layer of semiconductor material 208 from which the dummy gate oxide 245, the dummy polysilicon gate 246, and the hard mask 248 have been removed. A top surface of the sidewalls 24 may be visible in this top down view. This feature in the top down view was omitted for simplicity.

FIG. 2U is a cross-section of the integrated circuit die 200 taken along cross-section lines 2U as shown in FIG. 2T. FIG. 2U illustrates that the dummy gate oxide 245 and the dummy polysilicon gate 246 have been removed from the recesses 244 while the sidewall spacers 224 still remain.

FIG. 2V is a cross-section of the integrated circuit die 200 taken along cross-section lines 2V as shown in FIG. 2T. FIG. 2T illustrates that the sidewall spacers 224 are still in the recesses 244 in those regions of the integrated circuit die 200 which do not correspond to the gate region of the transistor 201. The inter-level dielectric layer 260 covers the raised source and drain regions 210, 212.

Figure 2W:
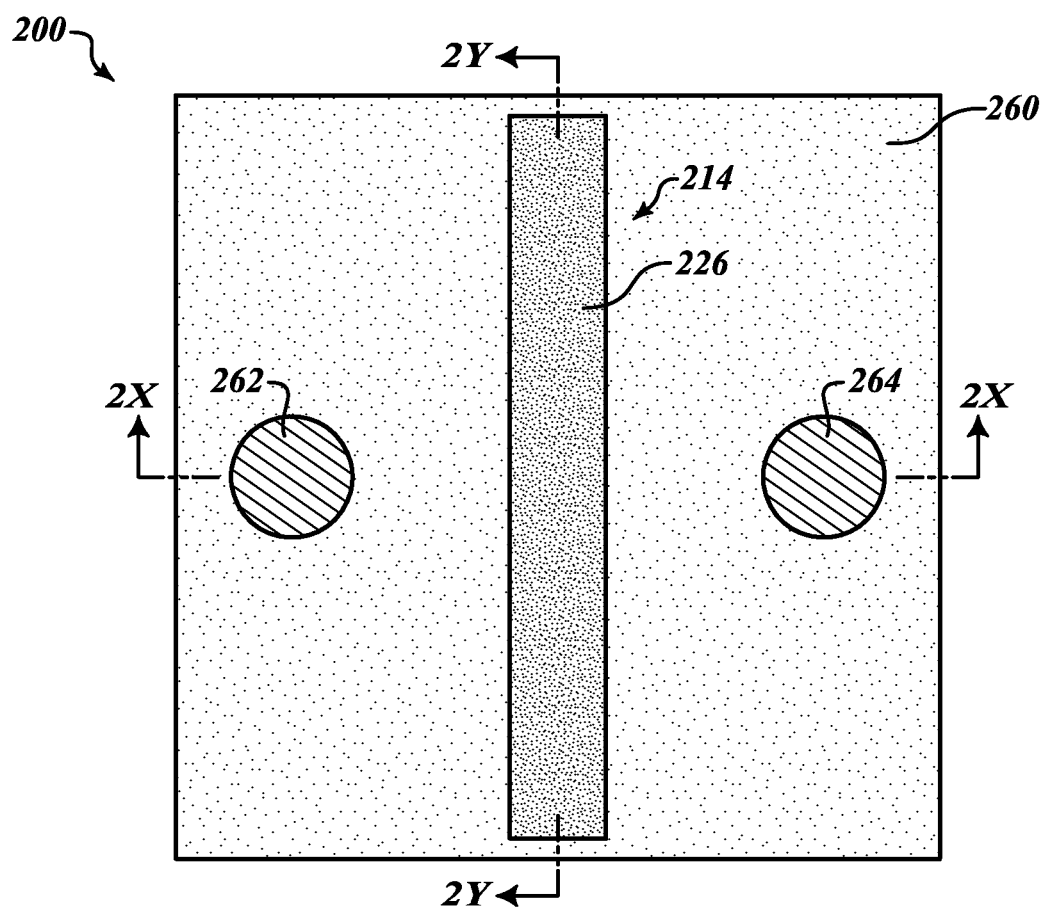
Figure 2X:
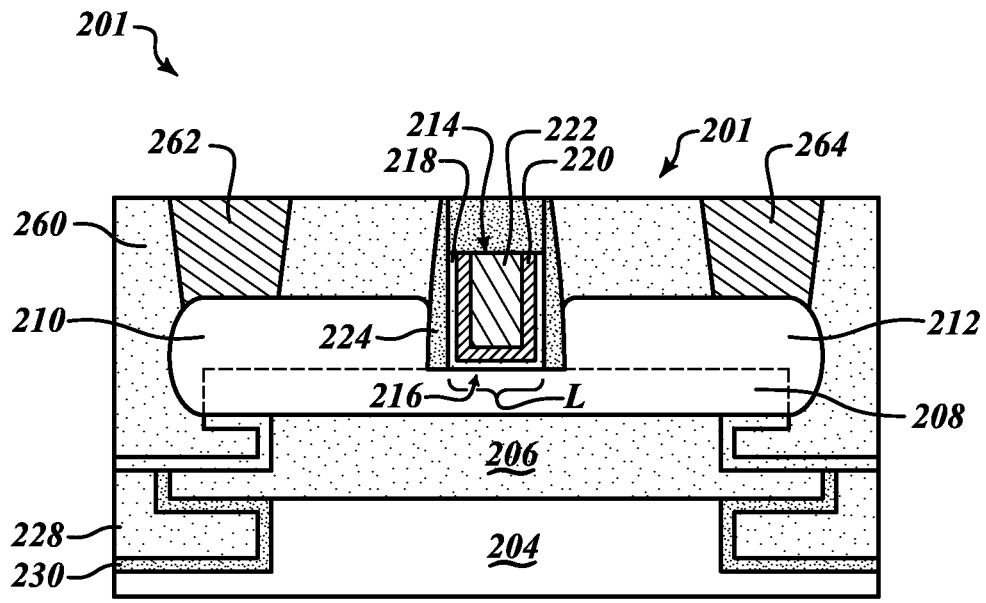
Figure 2Y:
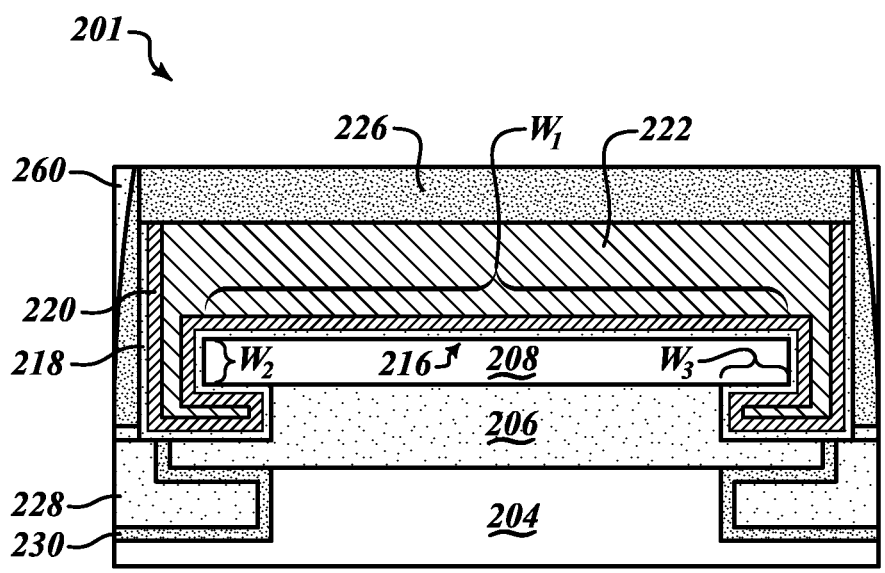

FIGS. 2W-2Y are views of the integrated circuit die after the high K gate dielectric 218, the liner 220, and the conductive material 222 have been deposited in those areas where the dummy gate oxide 245 and the dummy polysilicon gate 246 were previously removed. Additionally, the silicon nitride cap 226 has been formed on the gate structure 214, and conductive plugs 262, 264 have been formed in the inter-level dielectric layer 260.

FIG. 2W is a top view of the integrated circuit die 200. The top view of FIG. 2W illustrates the positions of the contact plugs 262, 264 in relation to the gate structure 214. Only the silicon nitride cap layer 226 is visible on the gate structure 214 in the top view of FIG. 2W.

FIG. 2X is a cross-section of the integrated circuit die 200 of FIG. 2W taken along cross-section lines 2X as seen in FIG. 2W. The high K gate dielectric 218 is positioned directly on the second layer of semiconductor material 208. The channel region 216 is located in the second layer of semiconductor material 208 directly below the gate dielectric 218. The length L of the channel 216 corresponds to the portion of the second layer of semiconductor material 208 in direct contact with the gate dielectric 218. The gate structure 214 further includes the liner 220 in direct contact with the gate dielectric 218.

In one embodiment, the gate dielectric 218 is a high K gate dielectric having a thickness between 1 and 2 nm. The gate dielectric 218 can include one or more of hafnium, zirconium, oxides of hafnium or zirconium, or other suitable materials for a high K gate dielectric. The gate dielectric can be deposited by CVD, physical vapor deposition (PVD), or any other suitable process for forming a high K gate dielectric. The thickness of the gate dielectric 218 can be selected to achieve a particular value of the threshold voltage $V_{th}$ of the transistor 201.

In one embodiment, the liner 220 includes one or more of gold, copper, titanium, tungsten, tantalum, or nitrides of those materials. The liner 220 can be deposited by CVD or PVD. The space between portions of the liner 220 is filled with a conductive material 222. In one embodiment, the conductive material 222 is tungsten.

The conductive plugs 262, 264 are formed by etching vias in the interlevel dielectric material 260 and then filling the vias with a conductive material. In one embodiment, the conductive plugs 262, 264 are made from tungsten. Alternatively, other suitable conductive materials can be selected for the plugs 262, 264.

One benefit of the transistor 201 is relaxed alignment constraints for the contact plugs 262, 264. This results from the recess 240 in the first layer of semiconductor material 204 and the outgrowth of the epitaxial layer of semiconductor material from the sidewall of the second layer of semiconductor material 208. The contact plugs 262, 264 can be further from the sidewall spacers 224 without the risk of shorting to the first layer of semiconductor material 204 due to a possible over etch of the BOX 208.

FIG. 2Y is a cross-section of the integrated circuit die 200 of FIG. 2W taken along cross-section lines 2Y. FIG. 2Y illustrates the increase in the channel width W of the transistor 201 such as in comparison with the channel width of the transistor 101 of FIGS. 1A-1C. In particular, the overall width W is a combination of $W_1$, $W_2$, and $W_3$. The width $W_2$ may be considered a height of the channel region. The width $W_1$ is significantly greater than the width $W_2$, i.e. the height. This is in contrast to a fin of a fin-fet structure, which has a height that is much greater than a width. In one embodiment, the width $W_1$ of the present disclosure is in the range of 40 and 400 nanometers and the width $W_2$ (height) is in the range of 4 and 12 nanometers. This gives a ratio of $W_1$ to $W_2$ (width:height) in the range of 10:1 and 100:3. This is in contrast to dimensions of a fin, which may have the height in the range of 35 and 50 nanometers and a width in the range of 6 and 12 nanometers (which corresponds to a ratio of the width to height in the range of 6:35 and 6:25). In one example, the width $W_1$ is about 100 nm. The width $W_1$ corresponds approximately to the channel width W of the transistor 101. The width W2 is about 5 nm. The width $W_3$ is about 10 nm. Thus, in one example the total channel width W of the transistor 201 is:

$$W=W_1+2W_2=2W_3=100 \text{ nm}+2(5 \text{ nm})+2(10 \text{ nm})=130 \text{ nm}.$$

Thus, the transistor 201 can result in a large increase in channel width W over the conventional planar transistor 101 of FIGS. 1A-1C. The increase in channel width W corresponds to an increase in the drain current ID. Because the channel width W has been increased without consuming an increased area of semiconductor substrate, the current footprint of the transistor 201 is increased with respect to the transistor 101 of FIGS. 1A-1C Furthermore, it is possible to obtain the benefit of using the first layer of semiconductor material 204 as a back gate for the transistor 201. Because the BOX layer 206 and the second layer of semiconductor material 208 are very thin, a voltage can be applied to the first layer of semiconductor material 204 to influence the channel region 216 of the transistor 201. In this way, the threshold voltage $V_{th}$ of the transistor 201 can be tuned by application of a selected voltage to the first layer of semiconductor material 204.

While FIGS. 2A-2Y and the related description have disclosed an integrated circuit die 200 implementing SOI technology, such description has been given only by way of example. Those of skill in the art will recognize, in light of the present disclosure, that principles of the present disclosure can be applied to semiconductor technologies other than SOI substrates without departing from the scope of the present disclosure. All such other applications fall within the scope of the present disclosure.

FIGS. 3A-3G illustrate a process for forming an integrated circuit die 300 including a transistor 301 having an increased channel width W as compared to the channel width W of the transistor 101 of FIGS. 1A-1C and other conventional transistor structures.

Figure 3A:
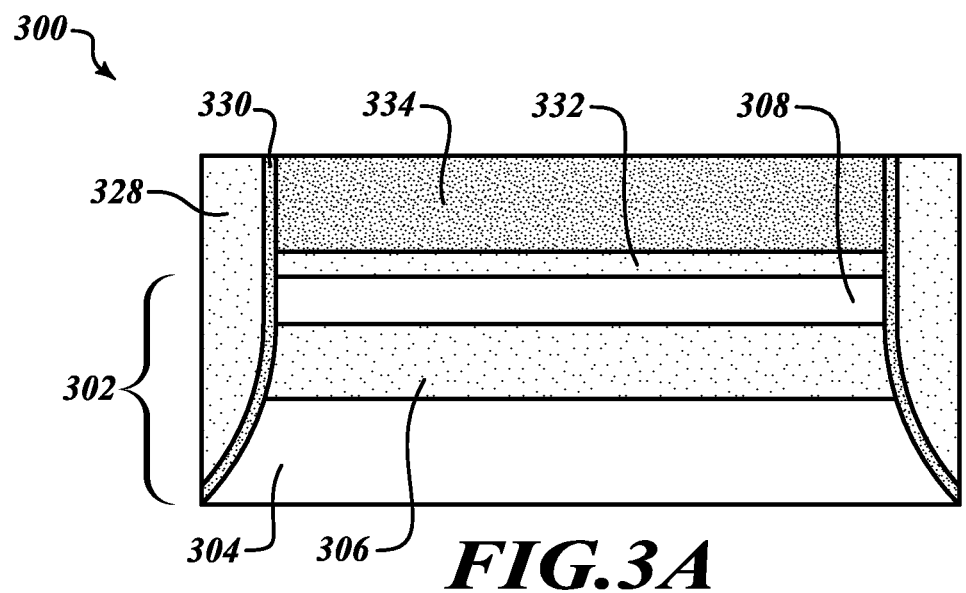
FIGS. 3A-3G illustrate views of an integrated circuit die including a transistor at various stages of processing, according to one embodiment.

FIG. 3A is a cross-section of the integrated circuit die 300 at an intermediate stage of processing. The integrated circuit die 300 includes an FDSOI substrate 302. The FDSOI substrate 302 includes a first layer of semiconductor material 304, a BOX layer 306 positioned directly on the first layer of semiconductor material 304, and a second layer of semiconductor material 308 positioned directly on the BOX layer 306. A pad oxide 332 is positioned on the second layer of semiconductor material 308. A layer of silicon nitride 334 is positioned on the pad oxide layer 332. Trench isolation regions 328 have previously been formed in the integrated circuit die 300. A dielectric liner 330 is positioned between the trench isolation region 328 and the FDSOI substrate 302. The materials for the trench isolation region 328 and the liner 330 are selected so that the material in the trench isolation region 328 can be selectively etched with respect to the material of the liner 330.

In one embodiment, the first layer of semiconductor material 304 is monocrystalline silicon between 10 and 30 nm thick. The BOX layer 306 is silicon dioxide between 10 and 25 nm thick. The second layer of semiconductor material 308 is monocrystalline silicon between 5 and 8 nm thick. Alternatively, other semiconductor materials and dielectric materials can be used for the first and second layers of semiconductor material 304, 308 and the BOX layer 306. The pad oxide layer 332 is between 1 and 3 nm thick. In one embodiment, the material of the shallow trench isolation region 328 is silicon dioxide and the material of the liner 330 is silicon nitride.

Figure 3B:
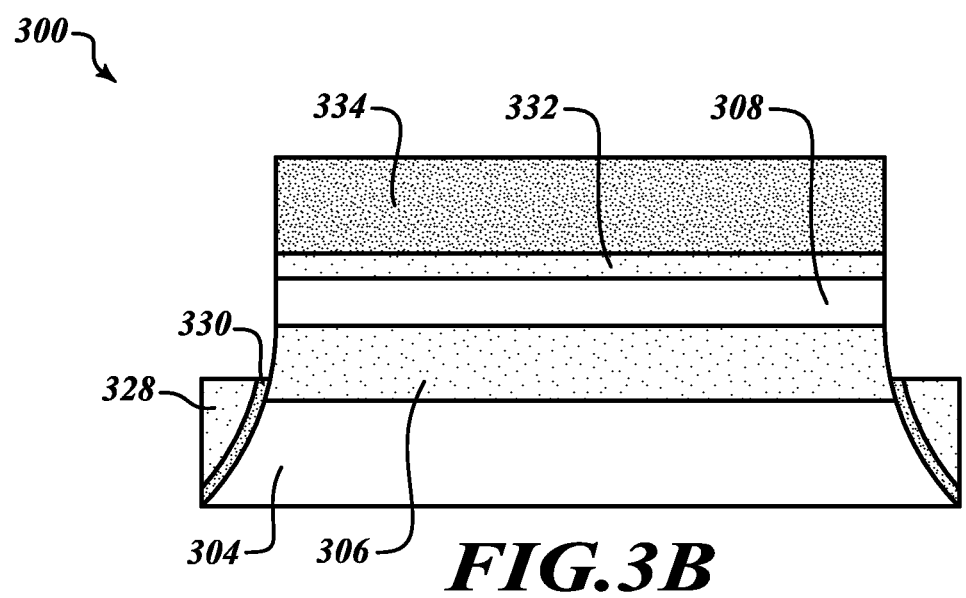

In FIG. 3B, the trench isolation region 328 and the liner 330 have been etched back to the BOX layer 306. This can be accomplished by first etching the material in the trench isolation region 328 to a position above the bottom of the BOX layer 306 and subsequently etching the liner 330 to the same position by using either a wet etch or a dry etch.

Figure 3C:
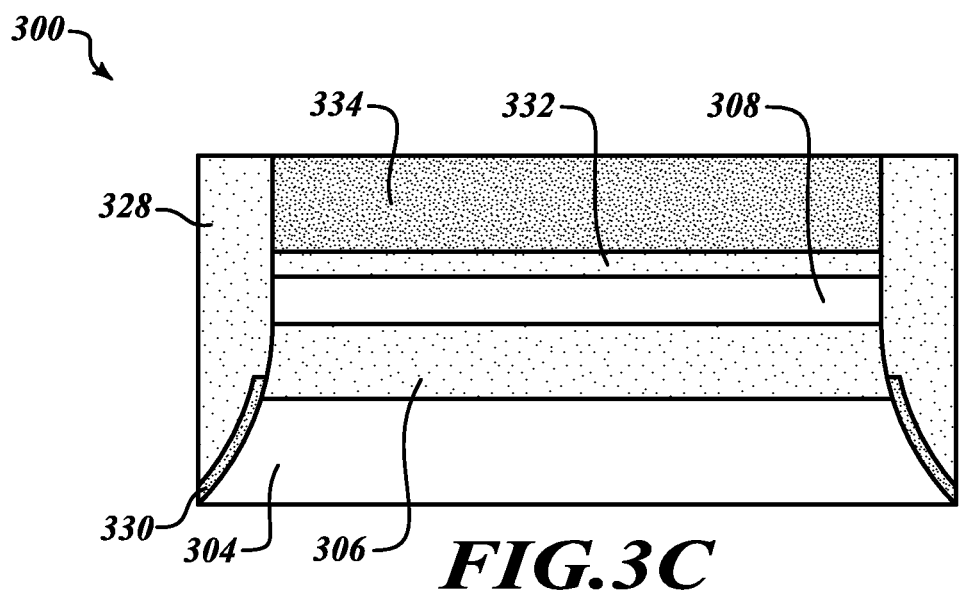

In FIG. 3C, the trench isolation region 328 has been refilled with dielectric material such as silicon dioxide. A chemical mechanical planarization process is then performed to planarize the top surface of the integrated circuit die 300, leaving the structure shown in FIG. 3C.

Figure 3D:
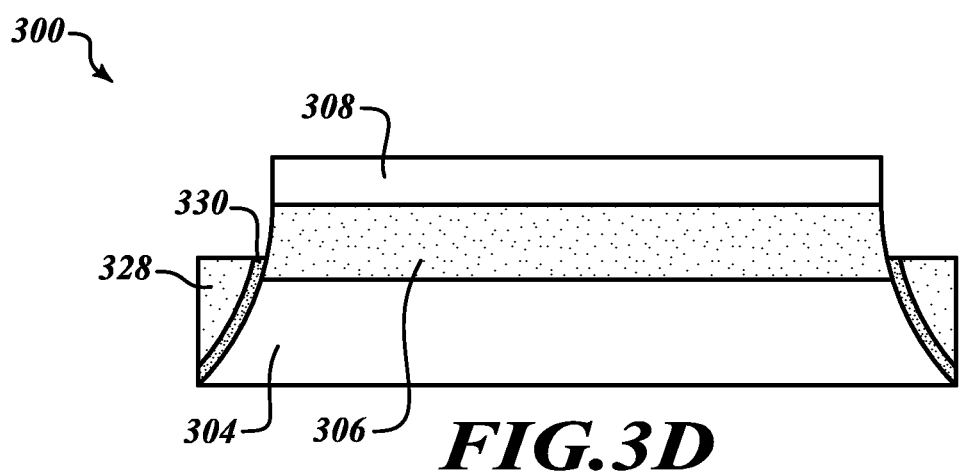

In FIG. 3D the silicon nitride layer 334 and the pad oxide layer 332 have been removed in successive etch steps. The trench isolation region 328 has also been recessed back to the BOX 306. During removal of the pad oxide 332, a very high concentration of HF is used to fully expose the sidewalls of the second layer of semiconductor material 308.

Figure 3E:
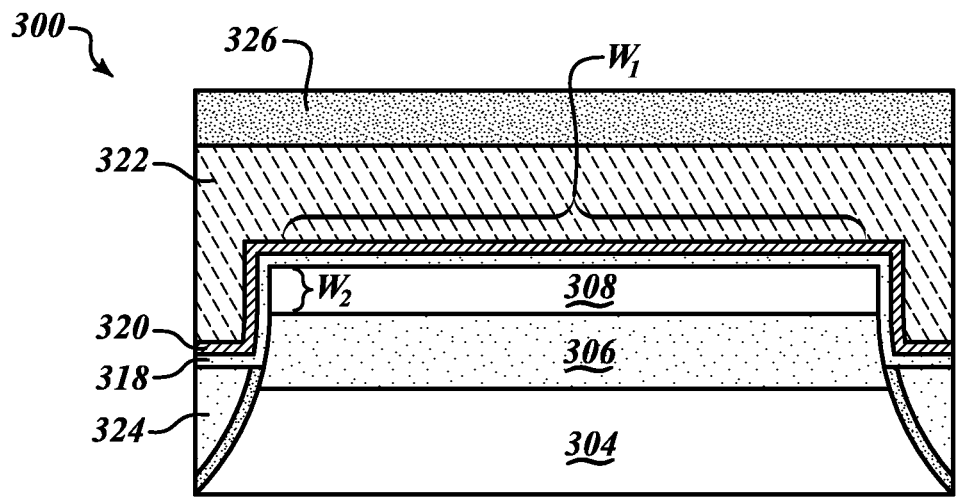

In FIG. 3E a high K gate dielectric 318 has been formed on the top and sidewalls in the second layer of semiconductor material 308. A thin layer 320 has been formed directly on the gate dielectric 318. A layer of polysilicon 322 has been formed on the layer 320. A silicon nitride hard mask 326 has been formed on the polysilicon 322.

FIG. 3E illustrates a larger channel width W of the transistor 301. In one example, the width W1 is about 100 nm. The width W1 may be similar to the entire channel width W of the transistor 101. The width W2 of the transistor 301 is about 5 nm. Thus, in one example, the total channel width W of the transistor 301 is:

$$W = W_1 2W_2 = 100 \text{ nm} + 2(5 \text{ nm}) = 110 \text{ nm}.$$

Thus, the transistor 301 can result in an increase in channel width of about 10% over the conventional planar transistor 101 of FIGS. 1A-1C.

Figure 3F:
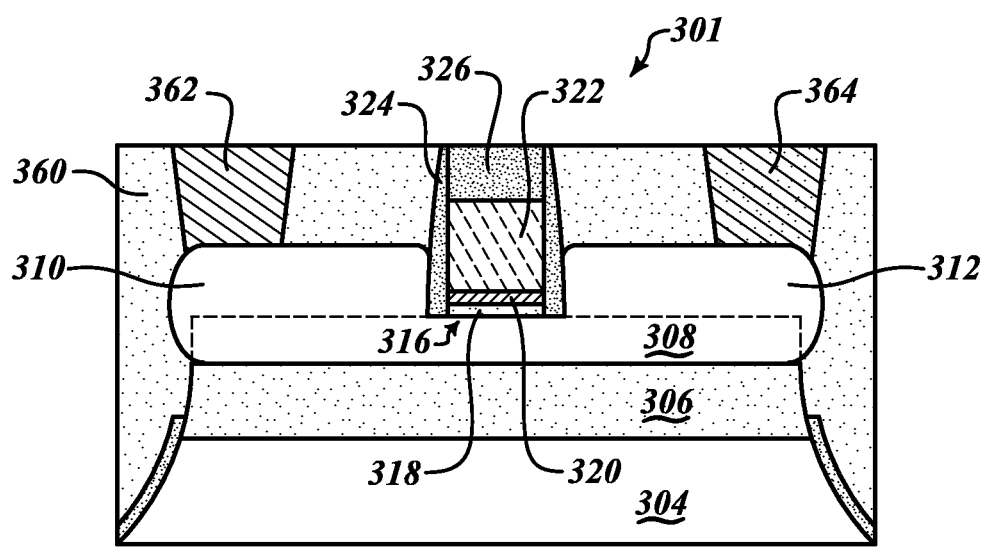
Figure 3G:
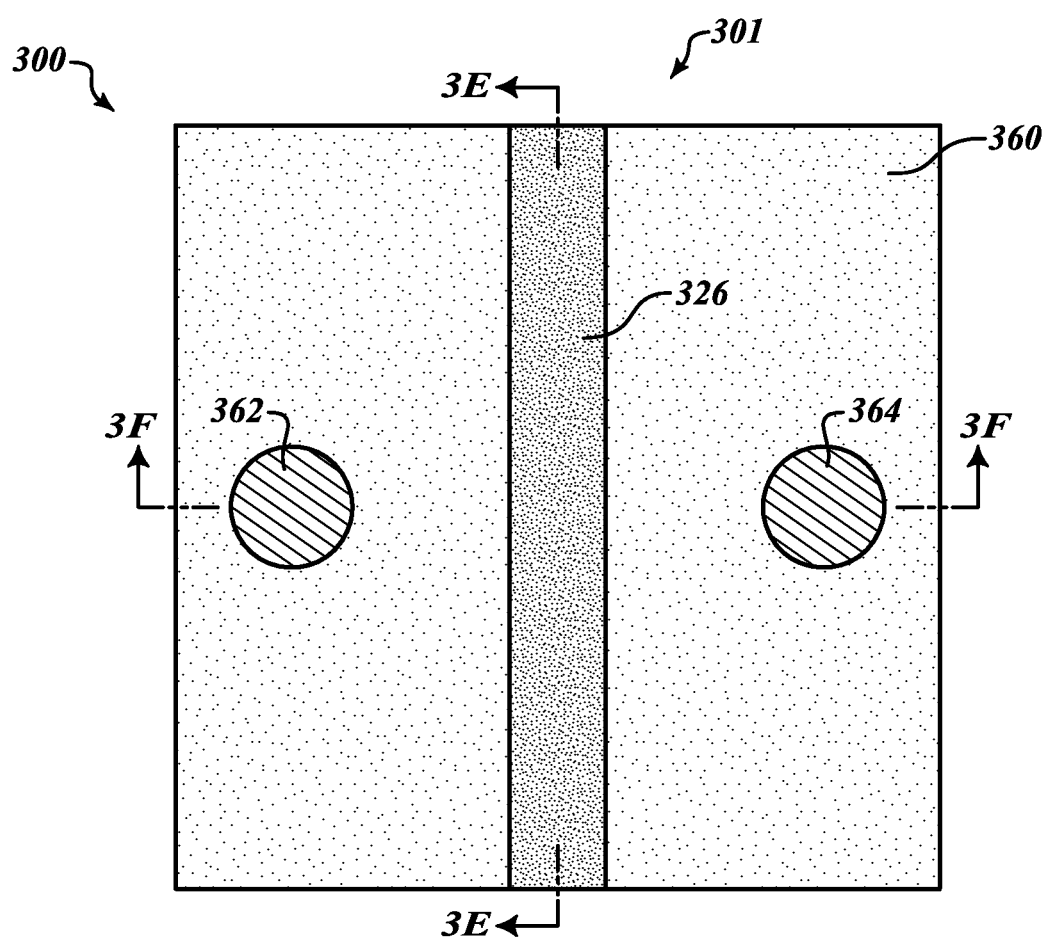

FIG. 3F is a cross-section of the integrated circuit die 300 taken along cross-section lines 3F as seen in FIG. 3G. The high K gate dielectric 318 is positioned directly on the second layer of semiconductor material 308. The channel region 316 is positioned in the second layer of semiconductor material 308 directly below the gate dielectric 318. The length L of the channel 316 corresponds to the portion of the second layer of semiconductor material 308 in direct contact with the gate dielectric 318. The gate structure 314 further includes the metal gate 320 in direct contact with the gate dielectric 318.

In one embodiment, the gate dielectric 318 is a high K gate dielectric having a thickness between 1 and 2 nm. The gate dielectric 318 can include one or more of hafnium, zirconium, oxide of those materials, or other suitable materials for a high K gate dielectric. The gate dielectric can be deposited by CVD, physical vapor deposition (PVD), or any other suitable process for forming a high K gate dielectric. The thickness of the gate dielectric 318 can be selected to achieve a particular value of the threshold voltage $V_{th}$ of the transistor 301.

In one embodiment, the layer 320 includes one or more of titanium, tungsten, tantalum, and nitrides of those materials. The layer 320 can be deposited by CVD or PVD. The space between portions of the layer 320 is filled with a conductive material 322. In one embodiment, the conductive material 322 is polysilicon.

The conductive plugs 362, 364 are formed by etching vias in the interlevel dielectric material 360 and then filling the vias with a conductive material. In one embodiment, the conductive plugs 362, 364 are made from tungsten. Alternatively, other suitable conductive materials can be selected for the plugs 362, 364.

FIG. 3G is a top view of the integrated circuit die 300. The top view of FIG. 3G illustrates the positions of the contact plugs 362, 364 in relation to the gate structure 314. Only the silicon nitride cap layer 226 is visible on the gate structure 314 in the top view of FIG. 3G.

One embodiment of the present disclosure is directed to an integrated circuit that includes a first layer of semiconductor material, a gate dielectric of a transistor positioned on a top surface and on a side surface of the first layer of semiconductor material. The gate dielectric may be directly on the first layer of semiconductor material. A gate electrode of the transistor is positioned on the gate dielectric on the top and side surfaces of the first layer of semiconductor material.

A source region of the transistor is formed in a second layer of semiconductor material and a drain region of the transistor is formed in the second layer of semiconductor material. The second layer of semiconductor material is on the first layer of semiconductor material.

Another embodiment is directed to a device that includes a substrate, a first layer of semiconductor material on the substrate, the first layer having a top surface, side surfaces, and a bottom surface, a first and a second recess between portions of the bottom surface of the first layer of semiconductor material and the substrate, and a gate structure on the first layer of semiconductor material and in the first and second recesses, the gate structure configured to interact with the top surface, the side surfaces, and the portions of the bottom surface of the first layer of semiconductor material.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit die, comprising:
   a first layer of semiconductor material;
   a first layer of dielectric material positioned on the first layer of semiconductor material;
   a second layer of semiconductor material positioned on the first layer of dielectric material, the second layer having a top surface, side surfaces, and a bottom surface, a central portion of the bottom surface being supported by the first layer of dielectric material, an exterior portion of the bottom surface being spaced from a top surface of the first layer of dielectric material by a distance; and
   a transistor including:
      a channel region in the second layer of semiconductor material;
      a gate dielectric positioned on the top surface, the side surfaces, and on the portion of the bottom surface of the second layer of semiconductor material; and
      a gate electrode positioned on the gate dielectric on the top surface, the side surfaces, and on the portion of the bottom surface of the second layer of semiconductor material.

2. The integrated circuit die of claim 1, comprising a recess in the first layer of dielectric material below the portion of the bottom surface of the second layer of semiconductor material, the gate dielectric being positioned on all surfaces of the recess.

3. The integrated circuit die of claim 2 wherein the gate electrode includes a portion that extends into the recess and is on the gate dielectric below the bottom surface of the second layer of semiconductor material.

4. The integrated circuit die of claim 3 wherein a total channel width of the transistor includes a height of the second layer of semiconductor material, a width of the top surface, and a width of the portion of the bottom surface above the recess.

5. The integrated circuit die of claim 1 wherein the gate dielectric is further positioned on a portion of the first layer of dielectric material that is below the portion of the bottom surface.

6. The integrated circuit die of claim 1 wherein the transistor comprises a source region and a drain region positioned on the second layer of semiconductor material.

7. The integrated circuit die of claim 1 wherein the second layer of semiconductor material has a height less than 10 nm.

8. The integrated circuit die of claim 1 wherein the gate dielectric is a high K gate dielectric including hafnium or zirconium.

9. The integrated circuit die of claim 1, wherein the first layer of semiconductor material is a back gate.

10. An integrated circuit die, comprising:
a transistor structure that includes:
a dielectric layer having a surface with a central area and an outer area;
a first layer of semiconductor material, the first layer of semiconductor material including a top surface, side surfaces, and a bottom surface, a first portion of the bottom surface being on the central area of the surface of the dielectric layer and a second portion of the bottom surface being spaced from the outer area by a distance;
a gate dielectric positioned on the top surface, on the second portion of the bottom surface, and on the side surfaces of the first layer of semiconductor material;
a gate electrode positioned on the gate dielectric on the top surface, on the portion of the bottom surface, and on the side surfaces of the first layer of semiconductor material, a portion of the gate electrode being between the dielectric layer and the second portion of the bottom surface of the first layer of semiconductor material;
a source region of the transistor is adjacent to the gate electrode; and
a drain region of the transistor is adjacent to the gate electrode.

11. The integrated circuit die of claim 10, comprising a first layer of dielectric material, the first layer of semiconductor material being positioned directly on the first layer of dielectric material.

12. The integrated circuit die of claim 11 wherein the first layer of dielectric material is recessed from the portion of the bottom surface of the first layer of semiconductor material.

13. The integrated circuit die of claim 10 wherein the top surface of the first layer of semiconductor material has a first width, each of the side surfaces has a first height, and the portion of the bottom surface has a second width.

14. The integrated circuit die of claim 13 wherein a total width of a channel formed in the first layer of semiconductor material including the first width, the first height for a first one of the sides, the first height for a second one of the sides, and the second width.

15. A device, comprising:
a buried oxide layer having a surface where the surface has a first portion and a second portion;
a first semiconductor region having a central portion and outer portions, the central portion being on the second portion of the buried oxide layer, the first portion of the buried oxide layer being separated from the outer portions of the first semiconductor region by a first space; and
a gate electrode positioned on the first semiconductor region, on the buried oxide layer, and in the first space.

16. The device of claim 15, further comprising a gate dielectric between the gate electrode and the first semiconductor region.

17. The device of claim 15 wherein the gate electrode includes a liner formed on the first semiconductor region, the buried oxide layer, and in the first space and a conductive material formed on the liner.

18. The device of claim 17 wherein a portion of the conductive material is in the space between a first portion of the liner and a second portion of the liner.

19. The device of claim 15 wherein the first semiconductor region includes a top surface, side surfaces, and a bottom surface and the gate electrode is on the top surface, the side surfaces, and a portion of the bottom surface.

20. The device of claim 15 wherein a second portion of the buried oxide layer is separated from the first semiconductor region by a second space, the gate electrode being positioned in the second space.

* * * * *